(12) United States Patent
Yokoyama et al.

(10) Patent No.: US 11,747,920 B2
(45) Date of Patent: Sep. 5, 2023

(54) COMPOUND-OPERATION INPUT DEVICE

(71) Applicant: Alps Alpine Co., Ltd., Tokyo (JP)

(72) Inventors: Tatsuya Yokoyama, Miyagi-ken (JP); Hiroki Utagawa, Miyagi-ken (JP); Takayuki Hirano, Miyagi-ken (JP)

(73) Assignee: Alps Alpine Co., Ltd.

( * ) Notice: Subject to any disclaimer, the term of this patent is extended or adjusted under 35 U.S.C. 154(b) by 0 days.

(21) Appl. No.: 17/693,671

(22) Filed: Mar. 14, 2022

(65) Prior Publication Data

US 2022/0197409 A1   Jun. 23, 2022

Related U.S. Application Data

(63) Continuation of application No. PCT/JP2020/036693, filed on Sep. 28, 2020.

(30) Foreign Application Priority Data

Oct. 23, 2019   (JP) .................................. 2019-193046

(51) Int. Cl.
*G06F 3/0362*   (2013.01)
*G06F 3/03*   (2006.01)

(52) U.S. Cl.
CPC .......... *G06F 3/0362* (2013.01); *G06F 3/0325* (2013.01)

(58) Field of Classification Search
CPC .... G06F 3/0362; G06F 3/0325; G06F 3/0338; G06F 3/0346; G06F 3/0312;
(Continued)

(56) References Cited

U.S. PATENT DOCUMENTS 4,782,327 A * 11/1988 Kley .................. G06F 3/03548
250/221
10,119,843 B2 * 11/2018 Yang ....................... G01D 5/32
(Continued)

FOREIGN PATENT DOCUMENTS

| JP | H02-031155 U | 2/1990 |
| JP | 2011-003505 A | 1/2011 |
| JP | 2019-110034 A | 7/2019 |

OTHER PUBLICATIONS

International Search Report for corresponding International Application No. PCT/JP2020/036693 dated Dec. 1, 2020 (2 Pages).

*Primary Examiner* — Temesghen Ghebretinsae
*Assistant Examiner* — Karin Kiyabu
(74) *Attorney, Agent, or Firm* — Harness, Dickey & Pierce, P.L.C.

(57) ABSTRACT

A compound-operation input device includes an operating member; a rotary mechanism configured to hold the operating member such that the operating member is rotatable; a slide mechanism configured to support the operating member such that the operating member is slidable in a sliding direction intersecting a rotation axis of the rotary mechanism; and a noncontact detector including a plurality of noncontact sensors and configured to detect a direction of movement and an amount of movement of a detection object, the detection object moving together with the operating member. The noncontact detector is one of a pair of noncontact detectors provided across the rotation axis from each other on a rotation locus of the detection object, the pair of noncontact detectors being at respective positions on a straight line orthogonal to the sliding direction.

3 Claims, 8 Drawing Sheets

(58) Field of Classification Search
CPC . H03K 2217/94063; H03K 2217/9651; H03K 17/968; H01H 25/00; H01H 89/00
See application file for complete search history.

(56) References Cited

U.S. PATENT DOCUMENTS

| | | |
|---|---|---|
| 10,704,931 B2 * | 7/2020 | Yang ..................... G06F 3/0312 |
| 2010/0321215 A1 | 12/2010 | Kato et al. |
| 2019/0286249 A1 * | 9/2019 | Chung .................. G06F 3/0304 |
| 2020/0019263 A1 * | 1/2020 | Korherr ............. B60R 11/0264 |

* cited by examiner

COMPOUND-OPERATION INPUT DEVICE

CLAIM OF PRIORITY

This application is a Continuation of International Application No. PCT/JP2020/036693 filed on Sep. 28, 2020, which claims benefit of Japanese Patent Application No. 2019-193046 filed on Oct. 23, 2019. The entire contents of each application noted above are hereby incorporated by reference.

BACKGROUND OF THE INVENTION

1. Field of the Invention

The present invention relates to a compound-operation input device.

2. Description of the Related Art

A hitherto disclosed compound-operation input device configured to accept a rotating operation and a sliding operation that is performed in a direction substantially orthogonal to an axis of rotation for the rotating operation is characterized as follows. A first detector, a second detector, and a slide holder are provided on a board. A holder/slider is slidably supported by the slide holder. A rotor is rotatably supported by the holder/slider. The holder/slider includes a first detection object. In the sliding operation, the rotor and the holder/slider slide together, and a change in the position of the first detection object that is caused by the sliding is detected by the first detector. The rotor includes a cylindrical member that surrounds the holder/slider, and a second detection object extending in the circumferential direction of the cylindrical member. The first detector and the slide holder are positioned on the inner side of a circle defined by projecting the cylindrical member onto the board. When the rotor is rotated, a change in the position of the second detection object that is caused by the rotation is detected by the second detector (see Japanese Unexamined Patent Application Publication No. 2011-3505, for example).

In the known compound-operation input device, the first detector detects a movement in the sliding direction, and the second detector detects a movement in the rotating direction. In such a configuration, when a sliding operation is performed, the second detector may detect a movement in the rotating direction, resulting in a detection error.

Accordingly, the present invention provides a compound-operation input device capable of correctly detecting an operation between a sliding operation and a rotating operation.

SUMMARY OF THE INVENTION

A compound-operation input device according to an embodiment of the present invention includes an operating member; a rotary mechanism configured to hold the operating member such that the operating member is rotatable; a slide mechanism configured to support the operating member such that the operating member is slidable in a sliding direction intersecting a rotation axis of the rotary mechanism; and a noncontact detector including a plurality of noncontact sensors and configured to detect a direction of movement and an amount of movement of a detection object, the detection object moving together with the operating member. The noncontact detector is one of a pair of noncontact detectors provided across the rotation axis from each other on a rotation locus of the detection object, the pair of noncontact detectors being at respective positions on a straight line orthogonal to the sliding direction.

According to the above embodiment of the present invention, a compound-operation input device capable of correctly detecting an operation between a sliding operation and a rotating operation can be provided.

DESCRIPTION OF THE PREFERRED EMBODIMENTS

Figure 1:
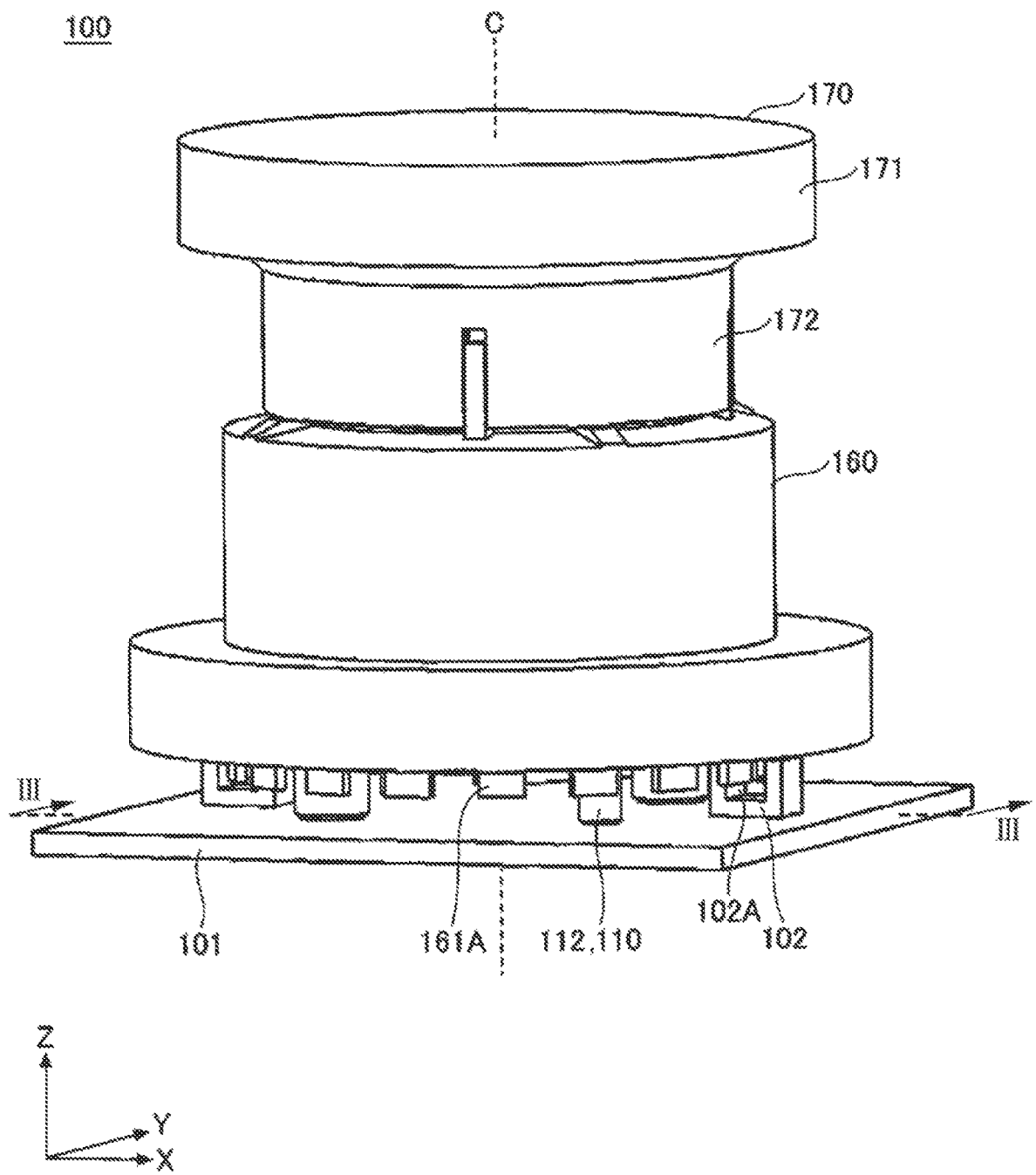
FIG. 1 illustrates a compound-operation input device according to an embodiment.
Figure 2:
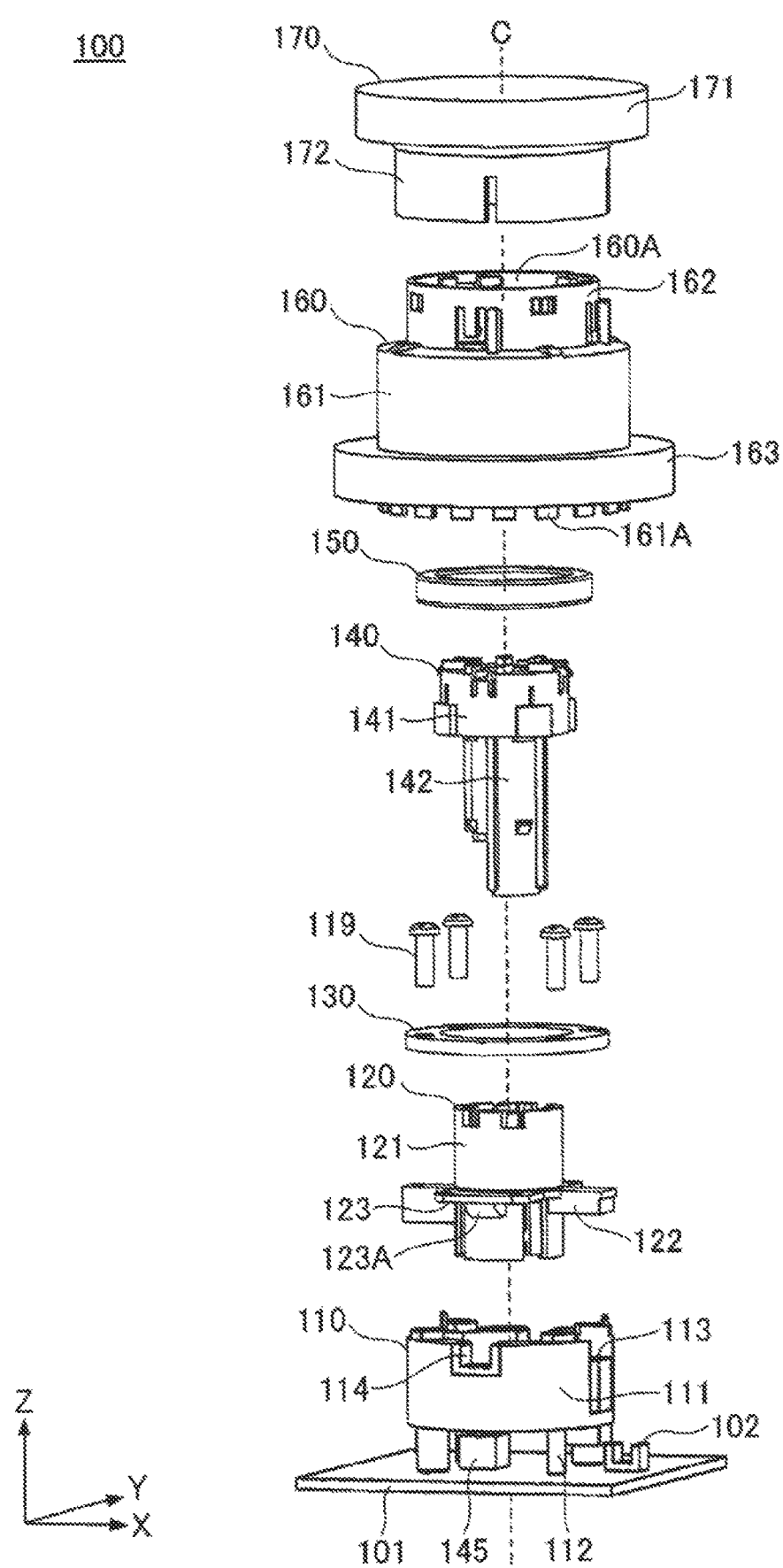
FIG. 2 is an exploded view of the compound-operation input device.
Figure 3:
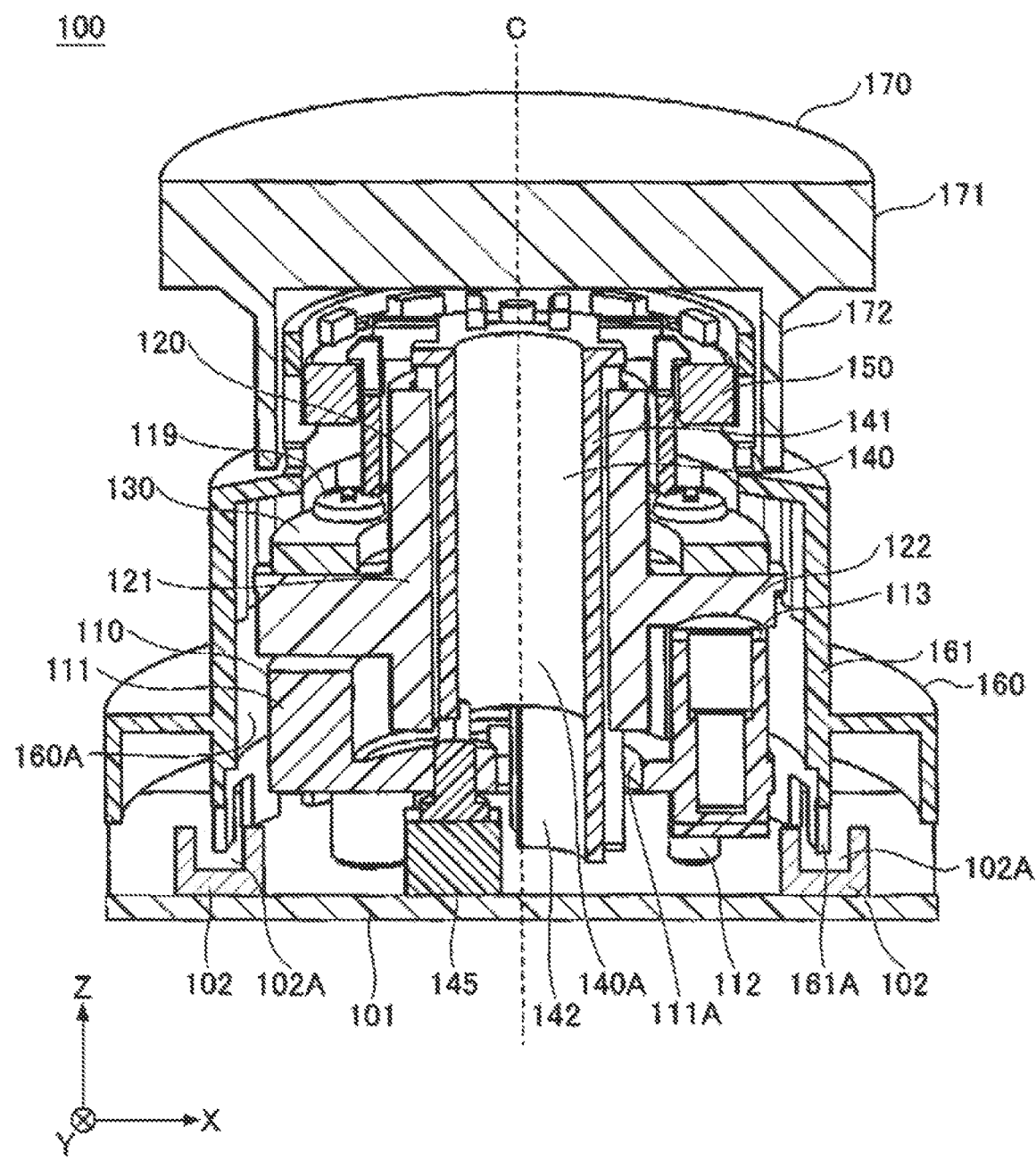
FIG. 3 illustrates a section taken along line III-III illustrated in FIG. 1.

An embodiment of the compound-operation input device according to the present invention will now be described. FIG. 1 illustrates a compound-operation input device 100 according to an embodiment. FIG. 2 is an exploded view of the compound-operation input device 100. FIG. 3 illustrates a section taken along line III-III illustrated in FIG. 1.

The following description is based on an X-Y-Z cartesian coordinate system. As a matter of convenience of description, surfaces and ends on the +Z side may be referred to as upper surfaces and upper ends, and surfaces and ends on the −Z side may be referred to as lower surfaces and lower ends. Such definitions do not necessarily represent universal relationships in the vertical position. In addition, a plan view refers to a view of an X-Y plane.

The compound-operation input device 100 includes a board 101, two photointerrupters 102, a base 110, a slider 120, a guide ring 130, a holder 140, a push switch 145, a bearing 150, a rotary member 160, and a knob 170.

The board 101 is, for example, a circuit board conforming to a type-4 frame retardant standard (FR4). The board 101 carries the photointerrupters 102, the base 110, and the push switch 145. The base 110 underlies the slider 120, the guide ring 130, the holder 140, the bearing 150, the rotary member 160, and the knob 170.

The two photointerrupters 102 are provided on the upper surface of the board 101. The two photointerrupters 102 are examples of the pair of noncontact detectors. The photointerrupters 102 each have a rectangular U shape in X-Z plan view, forming a groove 102A in a widthwise central part thereof in the X direction. The groove 102A is depressed downward from the upper surface of the photointerrupter 102.

Preferably, the two photointerrupters 102 are each a two-phase transmissive photointerrupter. In each of the photointerrupters 102, two light emitters are arranged side by side in the Y direction on one of a pair of opposite inner walls of the groove 102A, and two light receivers are arranged side by side in the Y direction on the other of the pair of inner walls of the groove 102A. The light receiver on the +Y side is capable of receiving a light beam emitted from the light emitter on the +Y side. The light receiver on the −Y side is capable of receiving a light beam emitted from the light emitter on the −Y side. In each of the photointerrupters 102, the pair of the light receiver and the light emitter that are on the +Y side and the pair of the light receiver and the light emitter that are on the −Y side serve as two transmissive photointerrupters, which are examples of the plurality of noncontact sensors.

Figure 4A:
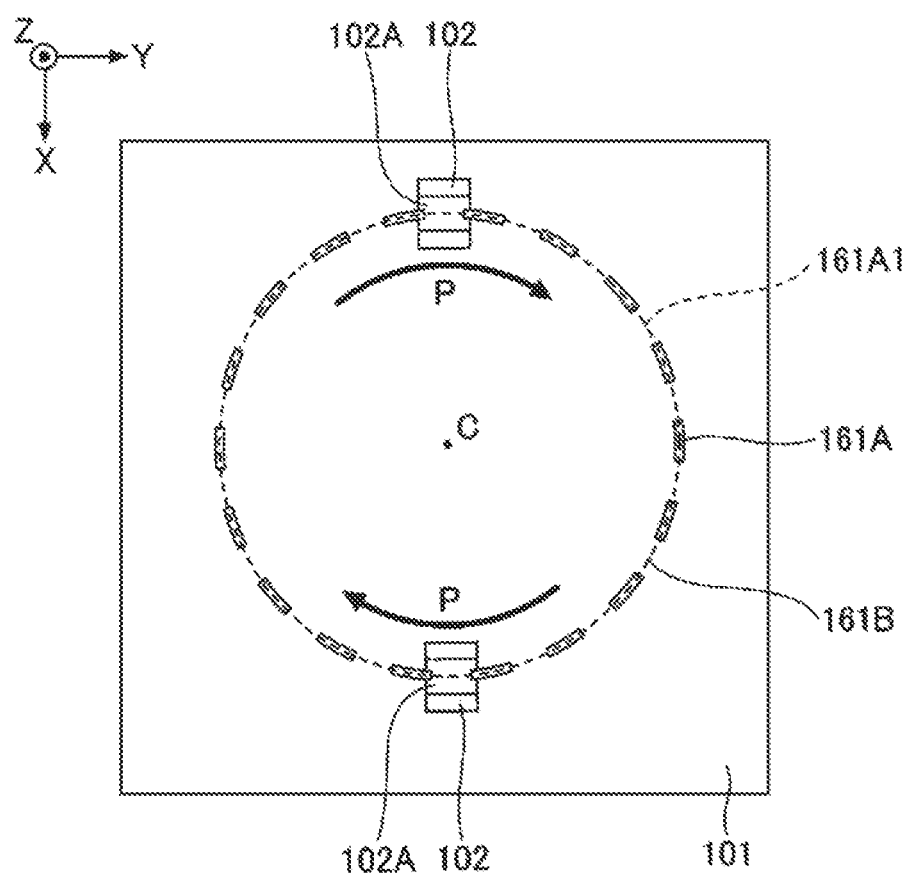
FIG. 4A illustrates the positional relationship between photointerrupters and projections of a rotary member.
Figure 4B:
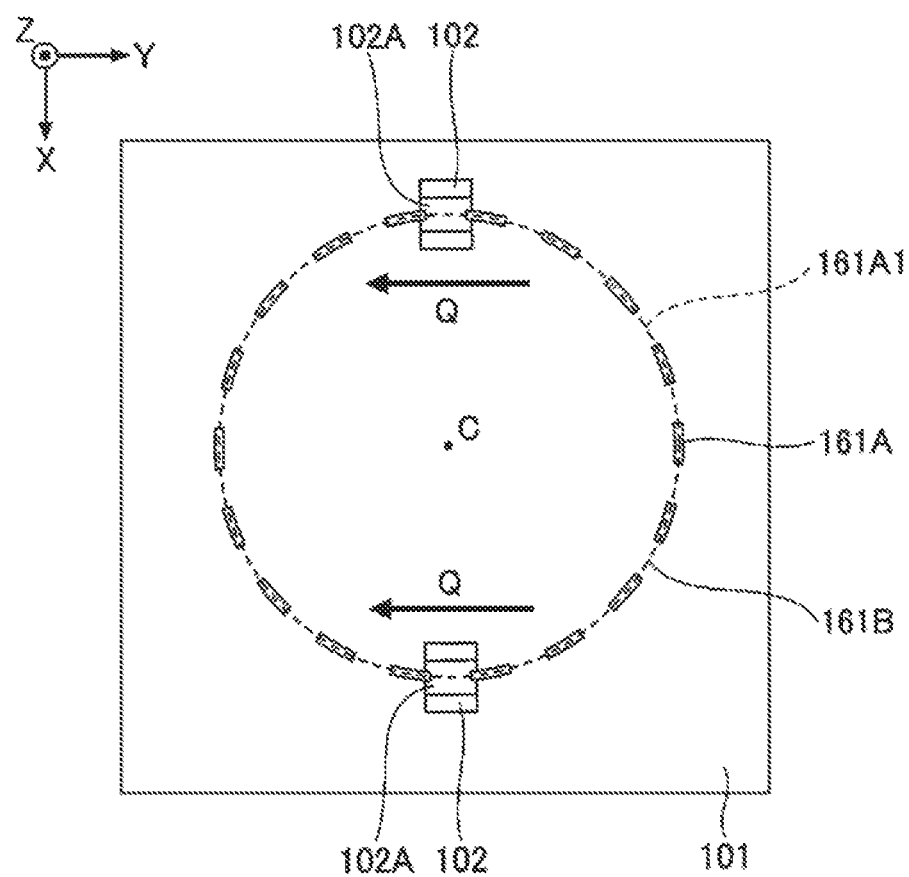
FIG. 4B illustrates the positional relationship between the photointerrupters and the projections of the rotary member.

The embodiment will further be described with reference to FIGS. 4A and 4B, in addition to FIGS. 1 to 3. FIGS. 4A and 4B illustrate the positional relationship between the photointerrupters 102 and a plurality of projections 161A (examples of the detection object that moves together with the operating member). The projections 161A are included in the rotary member 160. FIGS. 4A and 4B also illustrate a rotation locus 161A1, along which the projections 161A of the rotary member 160 rotate.

The photointerrupters 102 configured as above are positioned on the rotation locus 161A1 of the projections 161A of the rotary member 160 and across a rotation axis C, which is defined in the compound-operation input device 100, from each other in a direction orthogonal to the Y-axis direction (an example of the sliding direction intersecting the rotation axis). The rotary member 160 rotates about the rotation axis C and in a direction in which the plurality of projections 161A are arranged. Therefore, the rotation locus 161A1 of the projections 161A forms a circle centered on the rotation axis C and on which the plurality of projections 161A are arranged.

The photointerrupters 102 are of a two-phase type. Therefore, the direction of movement and the amount of movement of the rotary member 160 are detectable. The photointerrupters 102 each output two light-reception signals that indicate the states of light reception by the two respective light receivers. Therefore, the photointerrupters 102 are each capable of detecting a movement of the projections 161A of the rotary member 160 in a rotating direction illustrated in FIG. 4A and a movement of the projections 161A of the rotary member 160 in a sliding direction (the Y-axis direction) illustrated in FIG. 4B. A method of detection will be described separately below.

While the present embodiment relates to a case where two-phase transmissive photointerrupters are employed, the photointerrupters 102 may alternatively be of a reflection type. In the latter case, the detection object is preferred to be a reflector that reflects light, or an aluminum plating or a reflective seal. As another alternative to the two two-phase photointerrupters 102, four single-phase transmissive photointerrupters may be arranged in two pairs. As yet another alternative to the photointerrupters 102, magnetic sensors including magnets may be employed. In the last case, the detection object is preferred to be a magnet.

The base 110 is fixed to the upper surface of the board 101. The base 110 includes a cylindrical body 111 and three legs 112. The body 111 is fixed to the board 101 with the legs 112 and has a through-hole 111A, which extends in the Z direction through the plan-view center of the body 111. The body 111 has two grooves 113 and two grooves 114 at the upper end thereof. The grooves 113 are positioned opposite each other on a straight line extending in the X-axis direction. The grooves 114 are positioned opposite each other on a straight line extending in the Y-axis direction. The center axis of the through-hole 111A coincides with the rotation axis C.

The slider 120 is an example of the slide mechanism and includes a cylindrical body 121, tow projections 122, and two plate portions 123. The body 121 has an outside diameter smaller than the smallest inside diameter of the through-hole 111A provided in the body 111 of the base 110. The center axis of the cylindrical shape formed by the body 121 coincides with the rotation axis C.

The two projections 122 are cubic portions provided at a middle part of the body 121 in the Z direction and projecting in the +X and −X directions, respectively. The two projections 122 are received by the two grooves 113, respectively. The two projections 122 have a smaller width in the Y direction than the two grooves 113. Therefore, the slider 120 is movable in the Y direction with respect to the base 110. The gap between the outer wall of each of the projections 122 and the inner wall of a corresponding one of the grooves 113 that face each other in the Y direction is regarded as the maximum length by which the rotary member 160 is movable in the Y direction, and corresponds to the maximum stroke of the knob 170 in the Y direction.

The two plate portions 123 are plate-like portions provided at a middle part of the body 121 in the Z direction and projecting in the +Y and −Y directions, respectively. The lower surfaces of the plate portions 123 are in contact with the upper surface of the body 111 of the base 110. The plate portions 123 each have a projection 123A. The projection 123A projects from the lower surface of the plate portion 123 obliquely toward the body 121.

The projections 123A is received by a corresponding one of the grooves 114 of the base 110. The projections 123A have substantially the same width in the X direction as the grooves 114. Therefore, when the slider 120 moves in the Y direction with respect to the base 110, the projections 123A are guided at the widthwise outer walls thereof by the widthwise inner walls of the respective grooves 114 so as not to be displaced in the X direction. In such a movement, the plate portions 123 retain the slider 120 at a constant height with respect to the base 110 while being in contact with the upper surface of the body 111 of the base 110.

The projections 122 of the slider 120 configured as above are each slidable in the +Y direction and the −Y direction from the widthwise center of a corresponding one of the grooves 113.

The guide ring 130 is a thin annular member. With the slider 120 being positioned in the through-hole 111A of the base 110, the guide ring 130 is in contact with the slider 120 from above, whereby the projections 122 and the plate portions 123 of the slider 120 are prevented at the upper surfaces thereof from moving in the Z direction. The guide ring 130 is fixed to the base 110 with four screws 119. The center axis of the guide ring 130 coincides with the rotation axis C.

The holder 140 includes a cylindrical body 141 and a cylindrical shaft 142. The shaft 142 is continuous with the lower end of the body 141. A through-hole 140A extends through the plan-view centers of the body 141 and the shaft 142. The center axes of the cylindrical shapes formed by the body 141 and the shaft 142 coincide with the rotation axis C.

The circumference of the body 141 is recessed from the lower side toward the upper side. The recess extends over the entire circumference. The upper end of the slider 120 is positioned in the recess with a gap in the Z direction, whereby the slider 120 is held. The shaft 142 is fitted in a through-hole provided in the body 121 of the slider 120 and is held with the lower end thereof being in contact with the push switch 145. The holder 140 is held in such a manner as to be movable in the Z direction with respect to the slider 120. When the knob 170 is pushed, the holder 140 pushes the push switch 145 to turn on the push switch 145. The push switch 145 is provided for detecting the pushing of the knob 170 in the −Z direction.

The bearing 150 is an example of the rotary mechanism and has an annular shape. The bearing 150 includes an inner member and an outer member that are rotatable. The inner member is fitted on the outer circumference of the upper end of the body 141 of the holder 140. The rotation axis of the bearing 150 coincides with the rotation axis C.

The rotary member 160 includes a body 161, a projection 162, and a cover 163. The body 161, the projection 162, and the cover 163 are all cylindrical. The rotary member 160 has a through-hole 160A, which extends through the rotary member 160 in the Z direction. The center axis of the through-hole 160A coincides with the rotation axis C.

The projection 162 is continuous with the upper end of the body 161. The cover 163 is continuous with the lower end of the body 161. The projection 162, the body 161, and the cover 163 have respective outside diameters that increase in that order.

The rotary member 160 is fitted on the outer member of the bearing 150 at the inner circumferential surface thereof at the upper ends of the projections 161A, whereby the rotary member 160 is rotatable with respect to the holder 140. The rotary member 160 is held by the slider 120 with the bearing 150 and the holder 140 interposed therebetween and is therefore rotatable and slidable in the Y direction with respect to the base 110.

The body 161 extends in the −Z direction inside the cover 163 and has the plurality of projections 161A. The projections 161A are provided at the lower end of the body 161 and on the circumference of the body 161. The projections 161A are rectangular portions projecting from the lower end of the body 161 and are arranged at regular pitches in the circumferential direction of the body 161. Intervals 161B, provided between adjacent ones of the projections 161A, are also at regular pitches in the circumferential direction of the rotary member 160.

The projections 161A are allowed to pass through the grooves 102A of the photointerrupters 102 in the Y direction. The position of the projections 161A in the Z direction is set such that the projections 161A block the paths between the two light emitters and the two light receivers included in each of the photointerrupters 102.

The rotation locus 161A1 of the projections 161A and a circle defined by the body 161 in plan view have a common rotation axis, C. When the rotary member 160 rotates about the rotation axis C, the plurality of projections 161A rotate about the rotation axis C on the circle.

The width of each of the projections 161A in the circumferential direction and each of the intervals 161B are satisfactorily smaller than the amount of operation (stroke) in the Y direction that is to be achieved in the rotating operation or the sliding operation. Hence, in the rotating operation or the sliding operation, there is no chance that the light beams emitted from the two light emitters of each of the photointerrupters 102 are simultaneously and continuously blocked or allowed to pass by a single projection 161A. Thus, the states of the light beams change.

In each of the above photointerrupters 102, the light beams from the two light emitters that are allowed to pass are intermittently blocked by the projections 161A while the rotary member 160 is rotating. The light beams emitted from the two light emitters of each photointerrupter 102 are blocked or allowed to pass again with different timings.

Therefore, while the projections 161A of the rotary member 160 are rotating or sliding, the direction of the rotation or sliding can be found by detecting which of the two light beams emitted in each of the photointerrupters 102 is earlier to be blocked or allowed to pass again.

In an initial state where the two light receivers of each of the photointerrupters 102 are both receiving the respective light beams, if the projections 161A of the rotary member 160 slide in the Y direction, the projections 161A in the grooves 102A of the photointerrupters 102 move in the Y direction as illustrated in FIG. 4B. With such a movement of the rotary member 160 in the Y direction, one of the two light beams emitted in each of the photointerrupters 102 is blocked by one of the projections 161A, prevented from being received, earlier than the other. Thus, the state of light reception is varied between the two light receivers.

In another initial state where the two light receivers of each of the photointerrupters 102 are both prevented from receiving the respective light beams, if the projections 161A of the rotary member 160 move in the Y direction, the projections 161A in the grooves 102A of the two photointerrupters 102 move in the Y direction as illustrated in FIG. 4B. With such a movement of the rotary member 160 in the Y direction, one of the two light beams in each of the photointerrupters 102 that have been blocked by the projections 161A is allowed to pass and is received earlier than the other. Thus, the state of light reception is varied between the two light receivers.

In the initial state where the two light receivers of each of the photointerrupters 102 are both receiving the respective light beams, if the rotary member 160 undergoes, for example, clockwise rotation, the light receivers included two each in the two photointerrupters 102 positioned opposite each other on the circle output two pairs of light-reception signals that indicate opposite moving directions (the +Y direction and the −Y direction) of the rotary member 160 and the projections 161A as illustrated in FIG. 4A. The moving directions are represented by (clockwise) arrows P, which are identical in terms of the rotating direction.

In the initial state where the two light receivers of each of the photointerrupters 102 are both receiving the respective light beams, if the rotary member 160 is slid in, for example, the −Y direction, the projections 161A in the grooves 102A of the two photointerrupters 102 move in the −Y direction as illustrated in FIG. 4B. With such a movement of the rotary member 160 in the Y direction, the light beam emitted from at least one of the two light emitters in each of the photointerrupters 102 is blocked by one of the projections 161A. Thus, the state of light reception is varied between the two light receivers. In such a case, the two photointerrupters 102 output two pairs of light-reception signals that indicate moving direction of the rotary member 160 and the projections 161A that are identical. The moving directions are represented in FIG. 4B by arrows Q, which are identical in terms of the sliding direction (−Y direction).

The above variation in the state of light reception also applies to the following cases: a case where the rotary member 160 is rotated counterclockwise or is slid in the +Y direction, and a case where the rotary member 160 is rotated clockwise or counterclockwise or is slid in the +Y direction or the −Y direction in the initial state where the two light receivers of each of the photointerrupters 102 are both prevented from receiving the respective light beams or in another initial state where one of the two light receivers of each of the photointerrupters 102 is receiving the light beam. In all cases, the moving directions of the rotary member 160 and the projections 161A that are indicated by the two pairs of light-reception signals are identical in terms of the rotating direction if the rotary member 160 is moved in the rotating direction and are identical in terms of the sliding direction (Y direction) if the rotary member 160 is slid in the Y direction.

With the use of the two pairs of light-reception signals outputted from the two photointerrupters 102 when a rotating operation or a sliding operation is performed, the rotating operation and the sliding operation can be distinguished from each other.

The knob 170 is an example of the operating member and includes a disc-shaped body 171 and a cylindrical projection 172. The projection 172 is continuous with the lower end of the body 171. The projection 172 has a smaller outside diameter than the body 171. The body 171 is a portion to be directly or indirectly operated by the user. The projection 172 is fixed by being fitted on the outer circumference of the projection 162 of the rotary member 160. Therefore, the knob 170 and the rotary member 160 rotate together.

The rotary member 160 thus integrated with the knob 170 is held in such a manner as to be rotatable with respect to the holder 140. The holder 140 is slidable in the Y direction with respect to the base 110. Therefore, knob 170 is rotatable and is slidable in the Y direction with respect to the base 110. In terms of the sliding direction, the knob 170 is movable in the +Y direction or the −Y direction from the neutral position.

Figure 5:
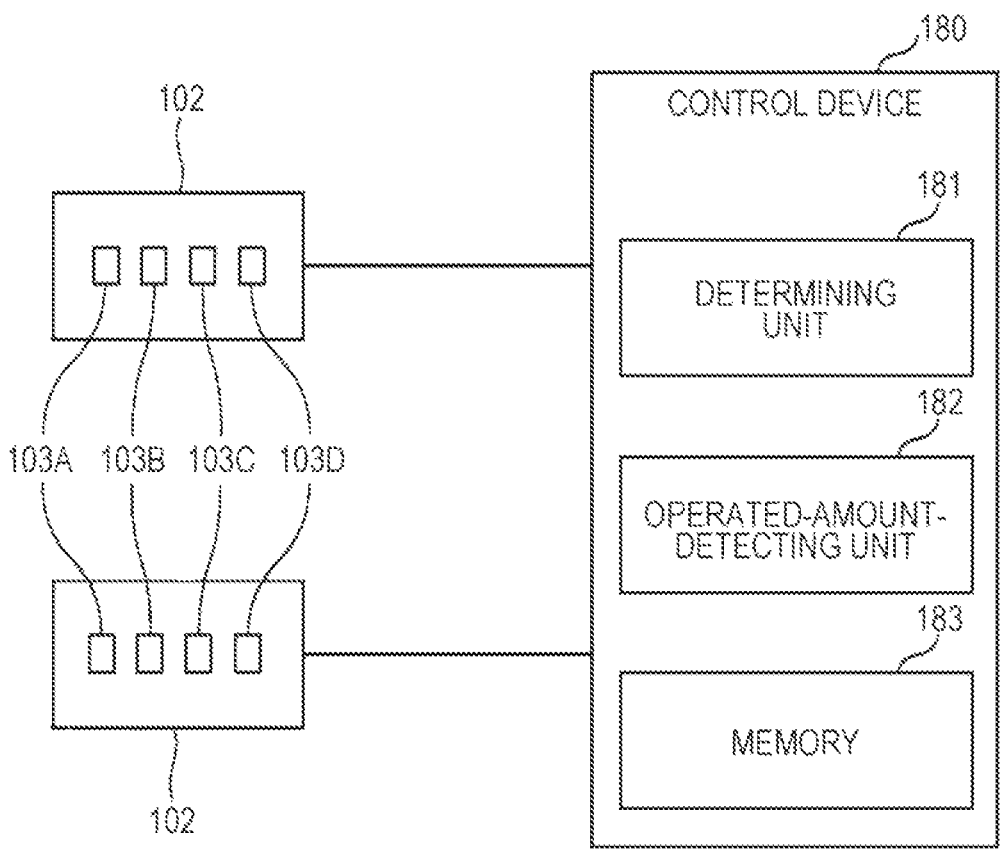
FIG. 5 illustrates a circuit configuration of the compound-operation input device.

FIG. 5 illustrates a circuit configuration of the compound-operation input device 100. FIG. 5 illustrates the photointerrupters 102 and a control device 180. The control device 180 may be provided inside (on the upper surface of the board 101, for example) the compound-operation input device 100 illustrated in FIGS. 1 to 3 or outside the compound-operation input device 100.

In FIG. 5, the photointerrupters 102 each include two light emitters 103A and 103C and two light receivers 103B and 103D. The light emitters 103A and 103C are examples of the light-emitting device. The light receivers 103B and 103D are examples of the light-receiving device. The photointerrupters 102 each output two light-reception signals that each indicate whether the a corresponding one of the light receivers 103B and 103D is receiving the light beam.

When a rotating operation or a sliding operation is performed on the knob 170, the two light-reception signals change in turn with a time gap. Such a level variation between the two light-reception signals indicates the direction in which the projections 161A of the rotary member 160 move in conjunction with the rotating operation or the sliding operation performed on the knob 170. The two light-reception signals are examples of the moving-direction information indicating the moving direction of the knob 170.

The control device 180 is embodied by, for example, a microcomputer including a central processing unit (CPU), a random access memory (RAM), a read-only memory (ROM), an input/output interface, an internal bus, and so forth.

Preferably, the control device 180 includes a determining unit 181, an operated-amount-detecting unit 182, and a memory 183. The determining unit 181 and the operated-amount-detecting unit 182 are functions to be executed as programs by the control device 180 and are illustrated as functional blocks. The memory 183 is a memory included in the control device 180 and is illustrated as a function.

Preferably, the determining unit 181 determines whether the operation performed on the knob 170 is a rotating operation or a sliding operation with reference to the pieces of moving-direction information indicating the moving direction of the knob 170. If the pieces of moving-direction information obtained as two pairs of light-reception signals outputted from the two respective photointerrupters 102 indicate respective moving directions of the projections 161A that are different in terms of the sliding direction of the rotary member 160 but are identical in terms of the rotating direction of the rotary member 160, the determining unit 181 determines that the knob 170 has been rotated in the direction indicated by those pieces of moving-direction information.

If the pieces of moving-direction information obtained as two pairs of light-reception signals outputted from the two respective photointerrupters 102 indicate respective moving directions of the projections 161A that are identical in terms of the Y direction, the determining unit 181 determines that the knob 170 has been slid in the direction indicated by those pieces of moving-direction information.

The operated-amount-detecting unit 182 detects the operated amount (stroke) in the rotating operation or the sliding operation with reference to the two pairs of light-reception signals outputted from the two respective photointerrupters 102. The operated amount in the rotating operation refers to the amount of movement by which the knob 170 is rotated in the rotating direction. The operated amount in the sliding operation refers to the amount of movement by which the knob 170 is operated in the Y direction. In either case, changes in the states of the light-reception signals that occur with the operation are detected, and the operated amount is determined with reference to the number of times such changes have occurred. The operated amount, i.e., the stroke, in the sliding operation is short. Such an operated amount may be detected between two levels: the state of no operation and the state of a full-stroke operation (whether or not any stroke has been made).

The memory 183 stores programs, data, and the like that are necessary for the control device 180 to perform relevant processes including the determination of whether the operation performed is the rotating operation or the sliding operation and the detection of the operated amount.

To summarize, two two-phase photointerrupters 102 are provided on the rotation locus 161A1 of the projections 161A of the rotary member 160 and on a straight line extending parallel to the X axis and passing through the rotation axis C. Therefore, the rotating operation and the sliding operation performed on the knob 170 can be distinguished from each other with reference to the two pairs of light-reception signals outputted from the two respective two-phase photointerrupters 102.

Such a configuration makes the compound-operation input device 100 be capable of correctly detecting the operation between a sliding operation and a rotating operation.

The operated amount in each of the sliding operation and the rotating operation is detected by the operated-amount-detecting unit 182 with reference to the light-reception signals outputted from the photointerrupters 102. Such a configuration makes the compound-operation input device 100 be capable of correctly detecting the operation between a sliding operation and a rotating operation and outputting information indicating the operated amount in each of the sliding operation and the rotating operation.

With the use of the two two-phase photointerrupters 102, the sliding operation and the rotating operation are detectable. Such a configuration simplifies the structure of the compound-operation input device 100.

In a known compound-operation input device including a sensor that detects a movement in a rotating direction and a sensor that detects a movement in a sliding direction, an operation in the sliding direction may be unintentionally detected as an operation in the rotating direction unless the amount of movement in the sliding direction is set satisfactorily smaller than the pitch in the rotating direction. Such a configuration limits the amount of movement in the sliding direction.

In contrast, the compound-operation input device 100 according to the above embodiment has no such limit imposed on the amount of operation in the sliding direction. Such a configuration provides the compound-operation input device 100 with a high degree of freedom in design.

Preferably, whether the operation performed is the rotating operation or the sliding operation is determined by the determining unit 181 with reference to the two pairs of light-reception signals outputted from the two respective two-phase photointerrupters 102. In such a configuration, whether the operation performed is the rotating operation or the sliding operation can be determined correctly, regardless of the timing of detection that varies with the relationship in size between the pitch of the projections 161A in the rotating direction and the stroke in the direction of operation.

Preferably, whether the operation performed is the rotating operation or the sliding operation is determined with reference to whether the moving directions of the rotary member 160 that are indicated by the two pairs of light-reception signals outputted from the two respective photointerrupters 102 are identical in terms of the rotating direction or in terms of the Y direction. In such a configuration, whether the operation performed is the rotating operation or the sliding operation can be determined correctly.

The above embodiment relates to a case where the operated amount in each of the sliding operation and the rotating operation is detected by the operated-amount-detecting unit 182 with reference to the light-reception signals outputted from the photointerrupters 102. Alternatively, an element that detects an operated amount in the sliding operation may be added.

Figure 6:
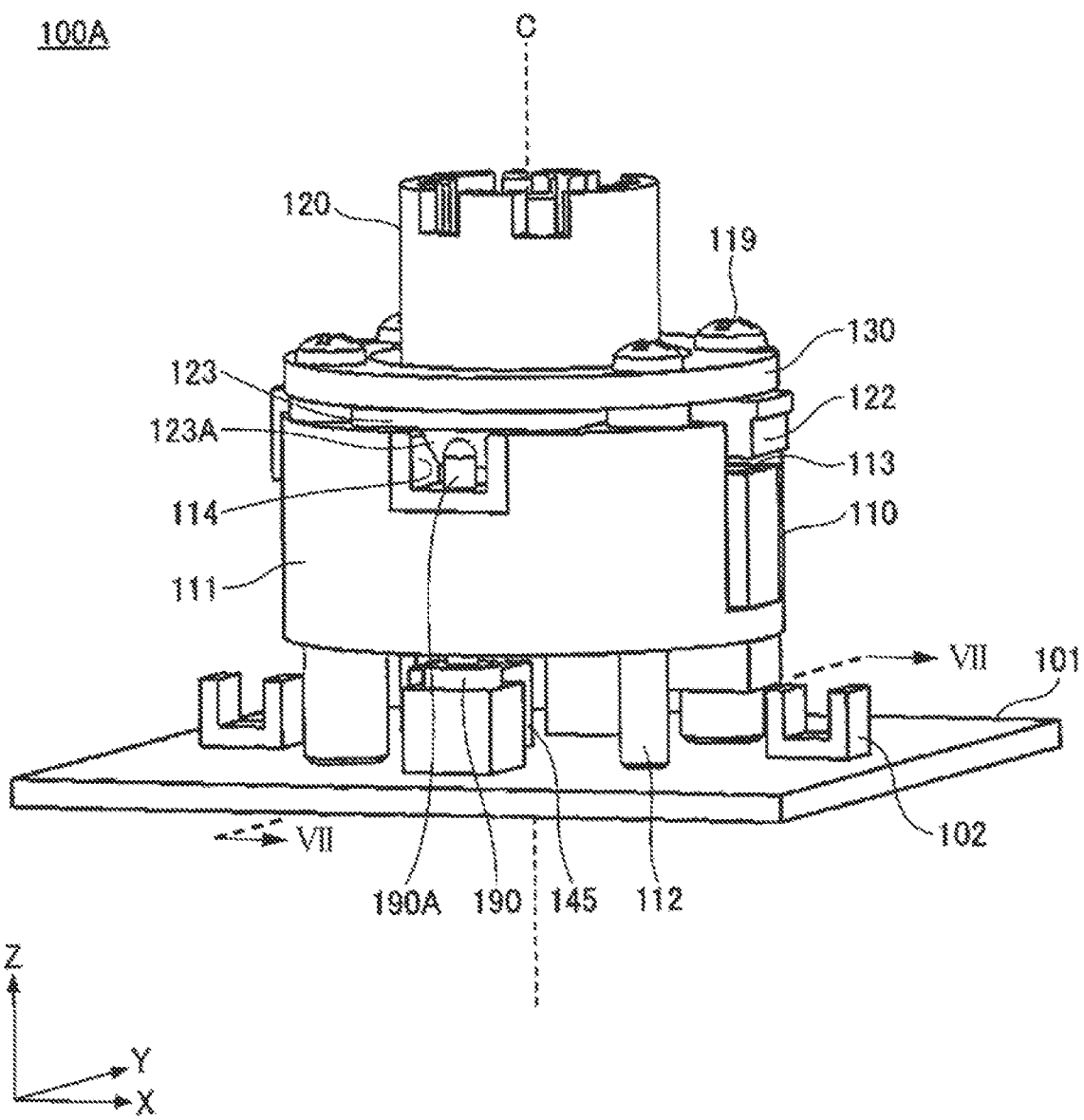
FIG. 6 illustrates a part of a compound-operation input device according to a modification of the embodiment.
Figure 7:
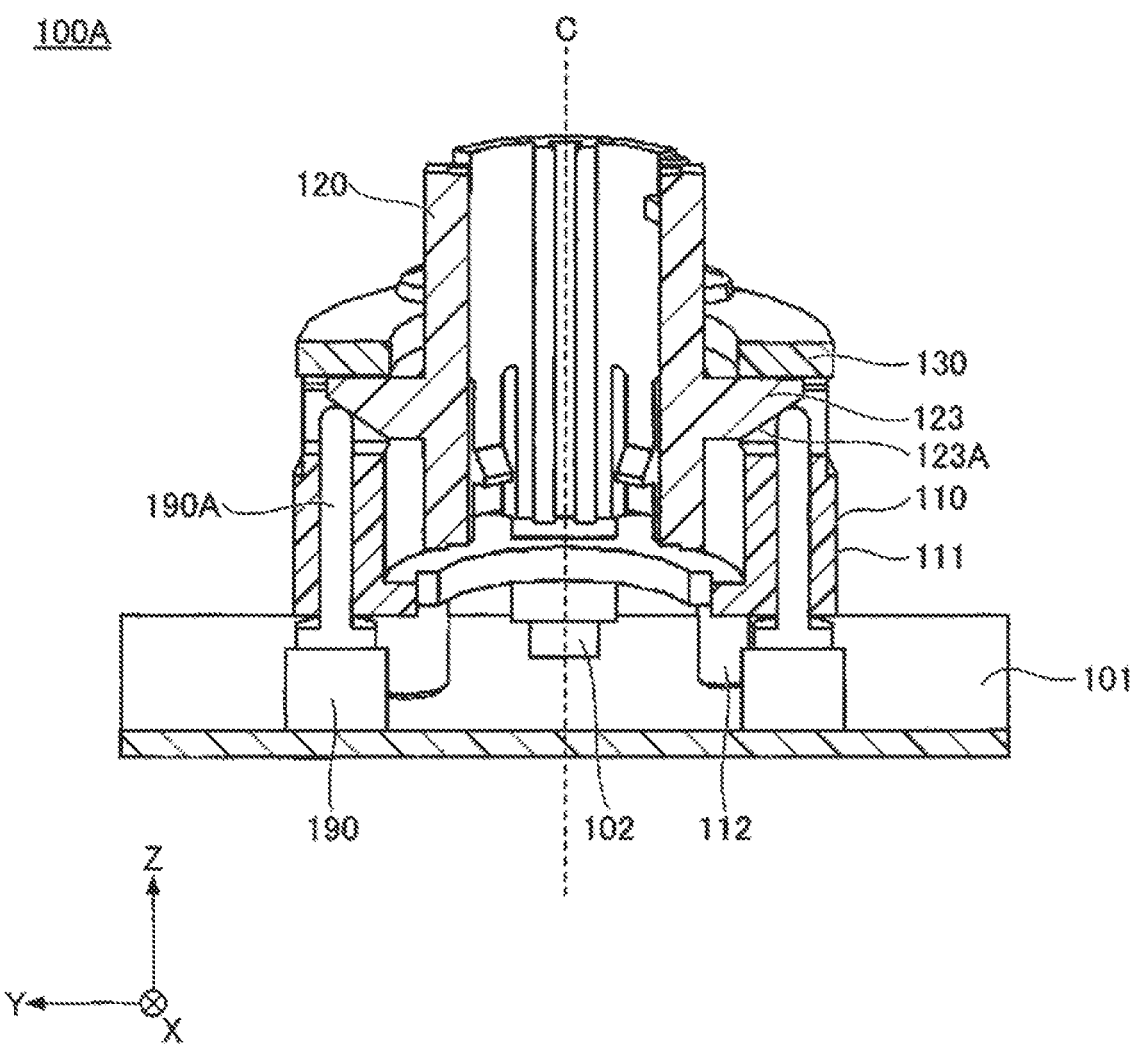
FIG. 7 illustrates a section taken along line VII-VII illustrated in FIG. 6.

FIG. 6 illustrates a part of a compound-operation input device 100A according to a modification of the embodiment. FIG. 7 illustrates a section taken along line VII-VII illustrated in FIG. 6. The compound-operation input device 100A illustrated in FIGS. 6 and 7 is obtained by adding two push switches 190 to the compound-operation input device 100 illustrated in FIGS. 1 to 3. In the following description and in FIGS. 6 and 7, description of elements, including the holder 140, the bearing 150, the rotary member 160, and the knob 170, having the same configurations as those described in the above embodiment is omitted.

The push switches 190 are provided on the upper surface of the board 101 and support the lower ends of respective actuators 190A from below. The actuators 190A each have a substantially round columnar shape and extend through respective through-holes provided in the body 111 of the base 110. The through-holes each extend from the lower surface of the body 111 to the respective grooves 114. The two push switches 190 are provided on the +Y side and the −Y side, respectively, on a straight line extending parallel to the Y axis, which is the sliding direction, and passing through the center axis C.

The push switches 190 may each be, for example, a metal-dome switch. The metal-dome switch includes a metal dome (not illustrated) that is convex upward when the switch is not pushed down in the −Z direction. When the switch is fully pushed down in the −Z direction, the metal dome is inverted to be convex downward, whereby a clicking sensation is given to the operator.

When the knob 170 is at the neutral position, where the knob 170 is operated in neither +Y nor −Y direction, the upper ends of the actuators 190A are slightly in contact with the slopes of the respective projections 123A of the slider 120.

When the knob 170 is slid in the +Y direction or the −Y direction, the slider 120 slides, whereby a corresponding one of the projections 123A pushes the upper end of a corresponding one of the actuators 190A. The projections 123A project obliquely with respect to the sliding direction between the body 121 and the lower surfaces of the plate portions 123 and therefore function as cams. When the knob 170 is slid in the +Y direction or the −Y direction, a corresponding one of the actuators 190A is pushed in the −Z direction, whereby a corresponding one of the push switches 190 is pushed in the −Z direction.

When the push switch 190 is fully pushed down, the metal dome is inverted to be convex downward and comes into contact with a contact point provided below the metal dome, whereby electrical connection is achieved. In this process, a clicking sensation is given to the operator through the knob 170.

In the compound-operation input device 100A including the above push switches 190, the moving direction is detected at an early stage of the input operation with reference to the light-reception signals outputted from the two photointerrupters 102 so that whether the operation performed is the rotating operation or the sliding operation is determined. If the operation performed is a sliding operation, the detection of the operated amount in the sliding operation by the operated-amount-detecting unit 182 is to be made with reference to signals outputted from the push switches 190, instead of the light-reception signals outputted from the two photointerrupters 102.

With the inversion of either of the metal domes included in the push switches 190, the determining unit 181 can assuredly detect that a sliding operation has been performed.

The above modification of the embodiment makes the compound-operation input device 100A be capable of correctly detecting the operation between a sliding operation and a rotating operation and more assuredly detecting that a sliding operation has been performed.

While some compound-operation input devices according to an exemplary embodiment of the present invention have been described above, the present invention is not limited to the embodiment specifically disclosed herein. Various modifications and changes can be made to the above embodiment without departing from the scope of the appended claims.

What is claimed is:

1. A compound-operation input device comprising:
an operating member;
a rotary mechanism configured to hold the operating member such that the operating member is rotatable;
a slide mechanism configured to support the operating member such that the operating member is slidable in a sliding direction intersecting a rotation axis of the rotary mechanism; and
a noncontact detector including a plurality of noncontact sensors and configured to detect a direction of movement and an amount of movement of a detection object, the detection object moving together with the operating member,
wherein the noncontact detector is one of a pair of noncontact detectors provided across the rotation axis from each other on a rotation locus of the detection object, the pair of noncontact detectors being at respective positions on a straight line orthogonal to the sliding direction, and further comprising:

a determining unit configured to determine whether an operation performed on the operating member is a rotating operation or a sliding operation with reference to a pair of pieces of moving-direction information respectively detected by the pair of noncontact detectors, the pair of pieces of moving-direction information respectively indicating a pair of directions of movement of the operating member, wherein the determining unit determines that the operation performed is the sliding operation if the pair of directions indicated by the pair of pieces of moving-direction information obtained from the pair of noncontact detectors are identical, and the determining unit determines that the operation performed is the rotating operation if the pair of directions are different.

2. The compound-operation input device according to claim 1, wherein the plurality of noncontact sensors are each a photointerrupter including a light-emitting device and a light-receiving device.

3. The compound-operation input device according to claim 1, wherein the pair of noncontact detectors each include a plurality of transmissive photointerrupters serving as the plurality of noncontact sensors.

* * * * *